(12) United States Patent
Chang et al.

(10) Patent No.: US 11,222,893 B2
(45) Date of Patent: Jan. 11, 2022

(54) SEMICONDUCTOR DEVICE INCLUDING TRANSISTORS SHARING GATES WITH STRUCTURES HAVING REDUCED PARASITIC CIRCUIT

(71) Applicant: TAIWAN SEMICONDUCTOR MANUFACTURING CO., LTD., Hsinchu (TW)

(72) Inventors: Yi-Feng Chang, New Taipei (TW); Po-Lin Peng, Taoyuan (TW); Jam-Wem Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/525,275

(22) Filed: Jul. 29, 2019

(65) Prior Publication Data

US 2019/0348416 A1 Nov. 14, 2019

Related U.S. Application Data

(62) Division of application No. 15/691,725, filed on Aug. 30, 2017, now Pat. No. 10,366,992.

(51) Int. Cl.
*H01L 29/87* (2006.01)
*H01L 27/092* (2006.01)
*H01L 29/10* (2006.01)
*H01L 27/02* (2006.01)
*H01L 21/8238* (2006.01)
*H01L 29/06* (2006.01)

(52) U.S. Cl.
CPC .. *H01L 27/0921* (2013.01); *H01L 21/823871* (2013.01); *H01L 27/0262* (2013.01); *H01L 29/0649* (2013.01); *H01L 29/1083* (2013.01); *H01L 29/87* (2013.01)

(58) Field of Classification Search
None
See application file for complete search history.

(56) References Cited

U.S. PATENT DOCUMENTS

| | | | |
|---|---|---|---|
| 5,686,752 A | 11/1997 | Ishimura et al. | |
| 6,229,185 B1 | 5/2001 | Chen | |
| 6,559,508 B1 * | 5/2003 | Lin | H01L 27/0266 257/355 |
| 8,823,129 B2 | 9/2014 | Lai et al. | |
| 9,099,523 B2 * | 8/2015 | Salman | H01L 29/7424 |
| 2003/0007301 A1 | 1/2003 | Ker et al. | |
| 2003/0058027 A1 * | 3/2003 | Kwon | H01L 27/027 327/401 |
| 2006/0033163 A1 * | 2/2006 | Chen | H01L 29/861 257/355 |
| 2009/0174470 A1 | 7/2009 | Tseng | |
| 2014/0167105 A1 * | 6/2014 | Salcedo | H01L 27/0262 257/140 |
| 2015/0008476 A1 * | 1/2015 | Shrivastava | H01L 27/0924 257/133 |

\* cited by examiner

*Primary Examiner* — Bilkis Jahan
(74) *Attorney, Agent, or Firm* — Maschoff Brennan

(57) ABSTRACT

A method includes the following operations: disconnecting at least one of drain regions that are formed on a first active area, of first transistors, from a first voltage; and disconnecting at least one of drain regions that are formed on a second active area, of second transistors coupled to the first transistors from a second voltage. The at least one of drain regions of the second transistors corresponds to the at least one of drain regions of the first transistors.

20 Claims, 5 Drawing Sheets

SEMICONDUCTOR DEVICE INCLUDING TRANSISTORS SHARING GATES WITH STRUCTURES HAVING REDUCED PARASITIC CIRCUIT

RELATED APPLICATION

This application is a divisional of U.S. application Ser. No. 15/691,725, filed Aug. 30, 2017, now U.S. Pat. No. 10,366,992, issued Jul. 30, 2019, the disclosure of which is hereby incorporated by reference herein in its entirety.

BACKGROUND

Latchup is a phenomenon of parasitic SCR paths triggered by internal or external noise in a CMOS circuit, which causes malfunction or electrical failure. Meanwhile, single event latchup caused by particle striking or electromagnetic radiation prevents the CMOS circuit from applications of aerospace, outer space, server and automobile, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
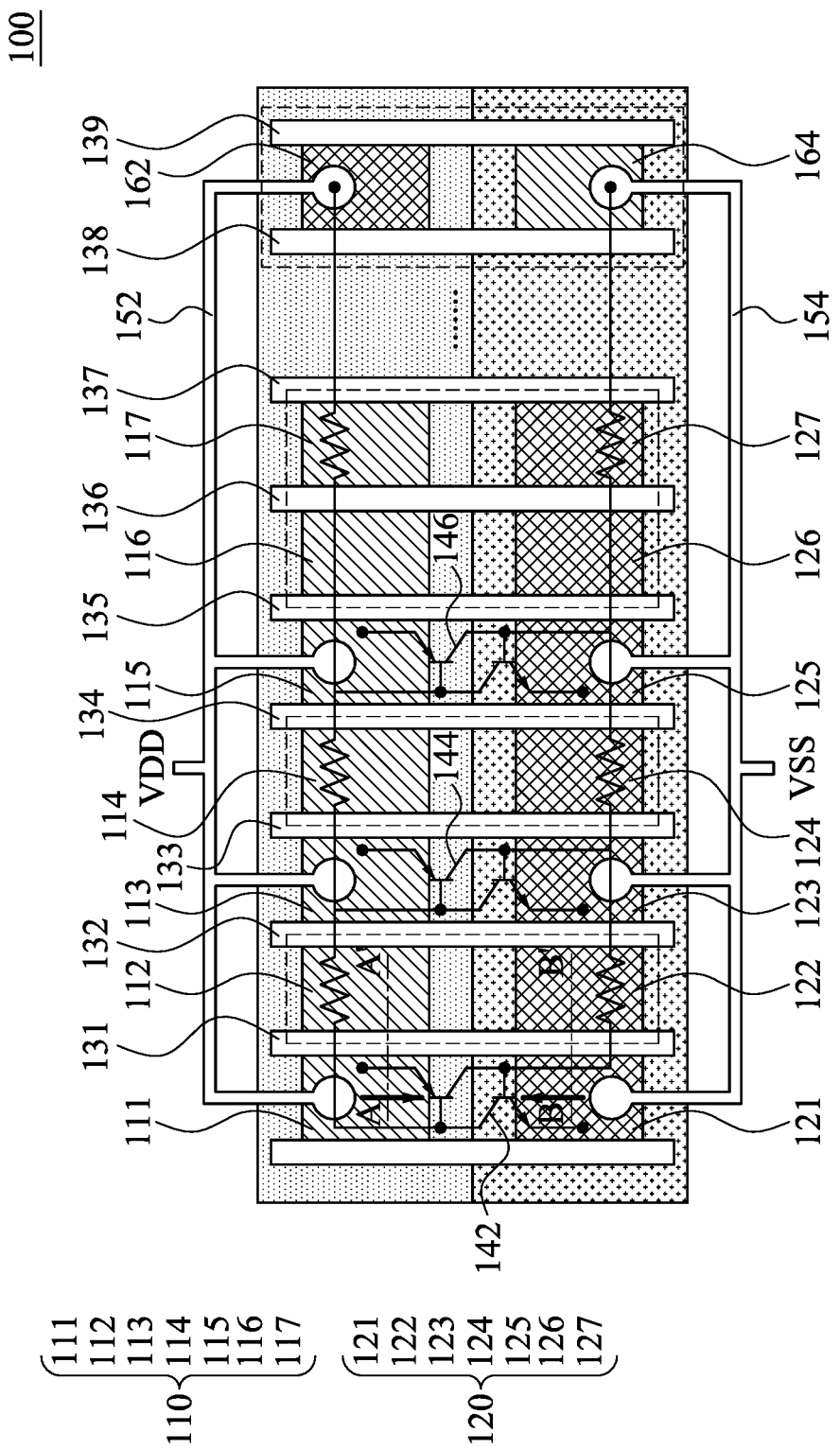
FIG. 1 is a diagram of a semiconductor device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a diagram of a semiconductor device 100, in accordance with various embodiments. As illustrated in FIG. 1, the semiconductor device 100 includes a first active area 110 of a first type, a second active area 120 of a second type, and a plurality of gates 131~139. The gates 131~139 are arranged above and across the first active area 110 and the second active area 120. In various embodiments, the first type is a P-type and the second type is an N-type. However, the scope of the disclosure is not intended to be limited in the above-mentioned types, and other suitable arrangement of types of the first type and the second type are within the contemplated scope of the present disclosure.

As illustrated in FIG. 1, a first region 111 of the first active area 110 and a first region 121 of the second active area 120 are disposed at a first side of a first gate 131 of the plurality of gates 131~139. A second region 112 of the first active area 110 and a second region 122 of the second active area 120 are disposed at a second side of the first gate 131. Explain in a different way, the first region 111 of the first active area 110 and the first region 121 of the second active area 120 are disposed at the left side of the first gate 131 of the plurality of gates 131~139. The second region 112 of the first active area 110 and the second region 122 of the second active area 120 are disposed at the right side of the first gate 131.

In various embodiments, the first region 111 and the third region 113 of the first active area 110 are coupled to a metal contact 152, and the first region 121 and the third region 123 of the second active area 120 are coupled to a metal contact 154.

In some embodiments, there are fourth region 114, fifth region 115, sixth region 116, and seventh region 117 of the first active area 110 and fourth region 124, fifth region 125, sixth region 126, and seventh region 127 of the second active area 120 in FIG. 1. The pattern is that the first regions 111, 121, the third regions 113, 123, and the fifth regions 115, 125 are coupled to the metal contact 152 or the metal contact 154, and the second regions 112, 122, the fourth regions 114, 124 are not coupled to the metal contact 152 or the metal contact 154. However, the scope of the disclosure is not intended to be limited in the above-mentioned configuration. As illustrated in FIG. 1, there are sixth regions 116, 126 and seventh regions 117, 127 that are not coupled to the metal contact 152 or the metal contact 154, and other suitable configuration are within the contemplated scope of the present disclosure. In various embodiments, the regions that are not coupled to the metal contact 152 or the metal contact 154 are configured as fillers.

In some embodiments, a region 162 and a region 164 are configured as body. The region 162 is coupled to the metal contact 152, and the region 164 is coupled to the metal contact 154. In various embodiments, the region 162 is the second type, and the region 164 is the first type.

Figure 2:
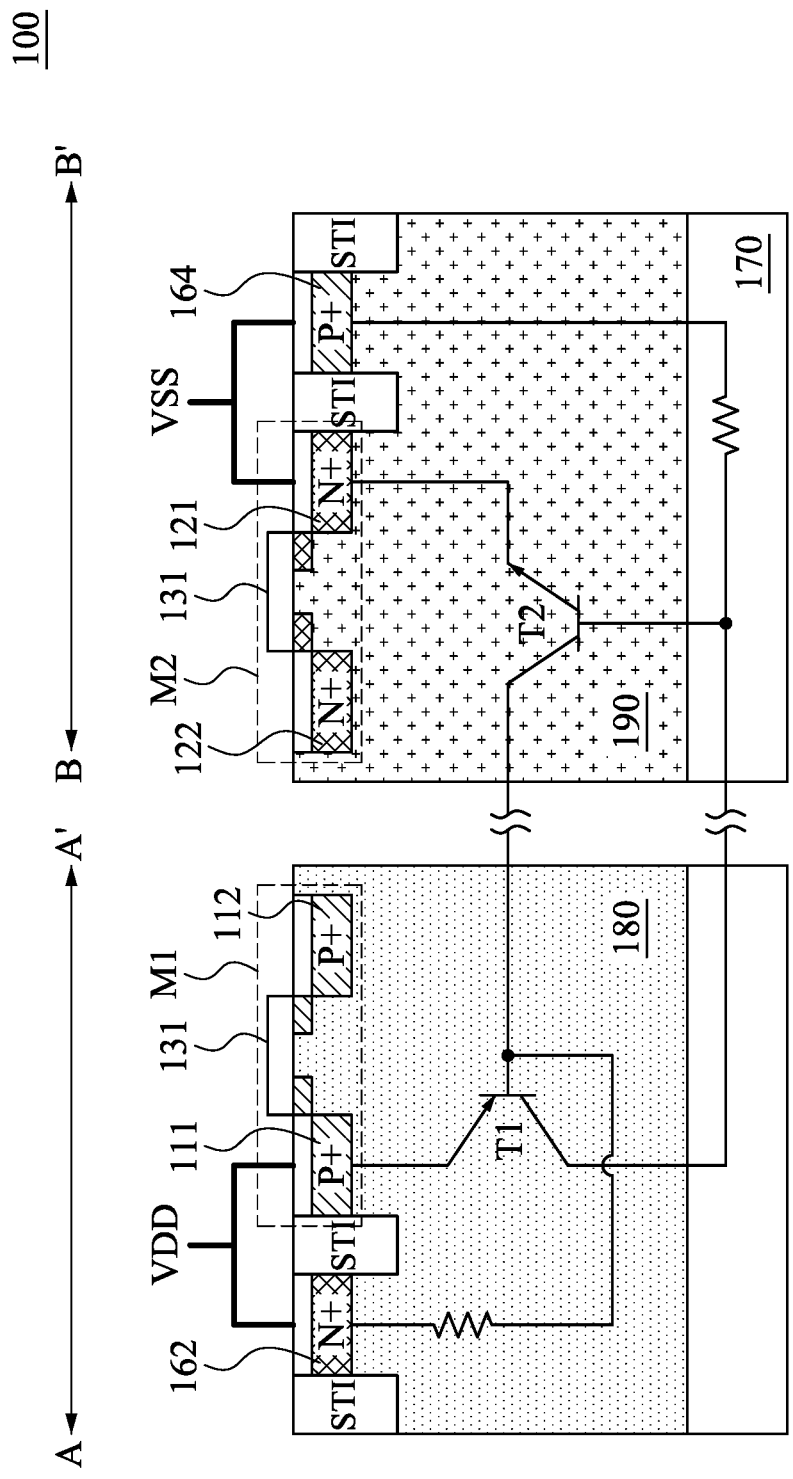
FIG. 2 is a cross-sectional view of the semiconductor device in FIG. 1, in accordance with various embodiments.

Reference is now made to FIG. 2. FIG. 2 is a cross-sectional view of the semiconductor device in FIG. 1, in accordance with various embodiments. It is noted that the cross-sectional view of the semiconductor device 100 in FIG. 2 is for explanation purpose for understanding the SCR circuits 142, 144, 146 in the semiconductor device 100, and it is not illustrated by actual cross-sectional structure of FIG. 1, which is described in detailed as below.

As illustrated in the left side of FIG. 2, it is a cross-sectional view of the semiconductor device 100 across line AA' in FIG. 1. It is noted that the direction of the line AA' in FIG. 1 is from the left side to the right side. The semiconductor device 100 further includes a substrate 170, and a first well 180 of the second type. The first well 180 of the second type is formed on the substrate 170. The first region 111 and the second region 112 of the first active area 110 are formed in the first well 180. The gate 131 is formed on the first well 180. The first region 111 of the first active area 110 is configured as a source region of a transistor M1, and the second region 112 of the first active area 110 is configured as a drain region of the transistor M1.

Reference is now made to the right side of FIG. 2. It is a cross-sectional view of the semiconductor device 100 across line BB' in FIG. 1. It is noted that the direction of the line BB' in FIG. 1 is from the right side to the left side, which is opposite to the direction of the line AA'. The semiconductor device 100 further includes a second well 190 of the first type. The second well 190 of the first type is formed on the substrate 170. The first region 121 and the second region 122 of the second active area 120 are formed in the second well 190. The gate 131 is formed on the second well 190. The first region 121 of the second active area 120 is configured as a source region of a transistor M2, and the second region 122 of the second active area 120 is configured as a drain region of the transistor M2.

In various embodiments, the first region 111 of the first active area 110, the first well 180, the second well 190, and the first region 121 of the second active area 120 are configured to operate as the equivalent SCR circuit 142. In some embodiments, the equivalent SCR circuit 142 is formed by a transistor T1 and a transistor T2. The emitter of the transistor T1 is coupled to the first region 111 of the first active area 110, the base of the transistor T1 is coupled to the body region 162 and the collector of the transistor T2, and the collector of the transistor T1 is coupled to the base of the transistor T2. The emitter of the transistor T2 is coupled to the first region 121 of the second active region 120, and the base of the transistor T2 is coupled to the body region 164.

Figure 3:
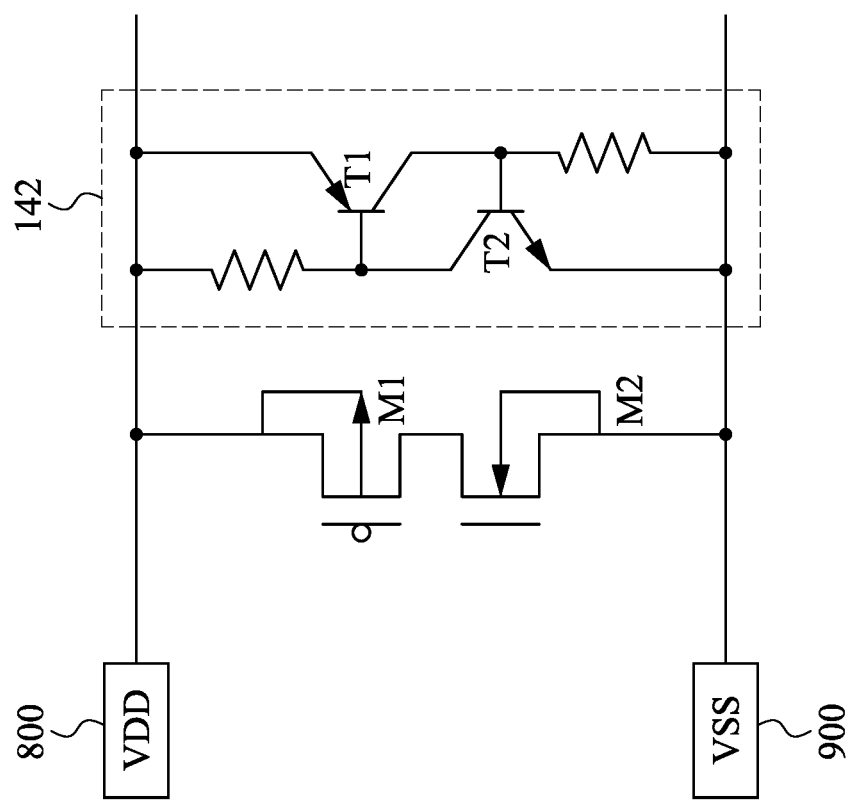
FIG. 3 is an equivalent circuit of the semiconductor device in FIG. 1, in accordance with various embodiments.

For further understanding the original circuit and the parasitic circuit in the semiconductor device 100, reference is now made to FIG. 3. FIG. 3 is an equivalent circuit of the semiconductor device 100 in FIG. 1, in accordance with various embodiments. As shown in FIG. 3, there are complementary metal oxide semiconductors (CMOS) and the equivalent SCR circuit 142. The CMOS is composed of a metal oxide semiconductor field effect transistor (MOSFET) M1 and a MOSFET M2. Reference is now made to both FIG. 2 and FIG. 3, the first region 111 of the first active area 110 is configured as a source region of the MOSFET M1, and the second region 112 of the first active area 110 is configured as a drain region of the MOSFET M1. In addition, the first region 121 of the second active area 120 is configured as a source region of the MOSFET M1, and the second region 122 of the second active area 120 is configured as a drain region of the MOSFET M2. The first region 111 of the first active area 110, the first well 180, the second well 190, and the first region 121 of the second active area 120 in FIG. 2 are configured to operate as the equivalent SCR circuit 142 in FIG. 3.

As illustrated in FIG. 3, if noises occur in the semiconductor device 100 and the base of the transistor T1 is pulled low, the transistor T1 is turned on and a power source 800 provides the first voltage VDD through the transistor T1 to the base of the transistor T2. Subsequently, the transistor T2 is turned on due to the first voltage VDD, and a short path is therefore formed in the semiconductor device 100, such that a high current leakage from the power source 800 to the ground 900 occurs. However, the configuration of the semiconductor device 100 in FIG. 1 may improve the above-mentioned phenomenon. The following description explains how to improve the above-mentioned phenomenon together with a flow chart of a method 400.

Figure 4:
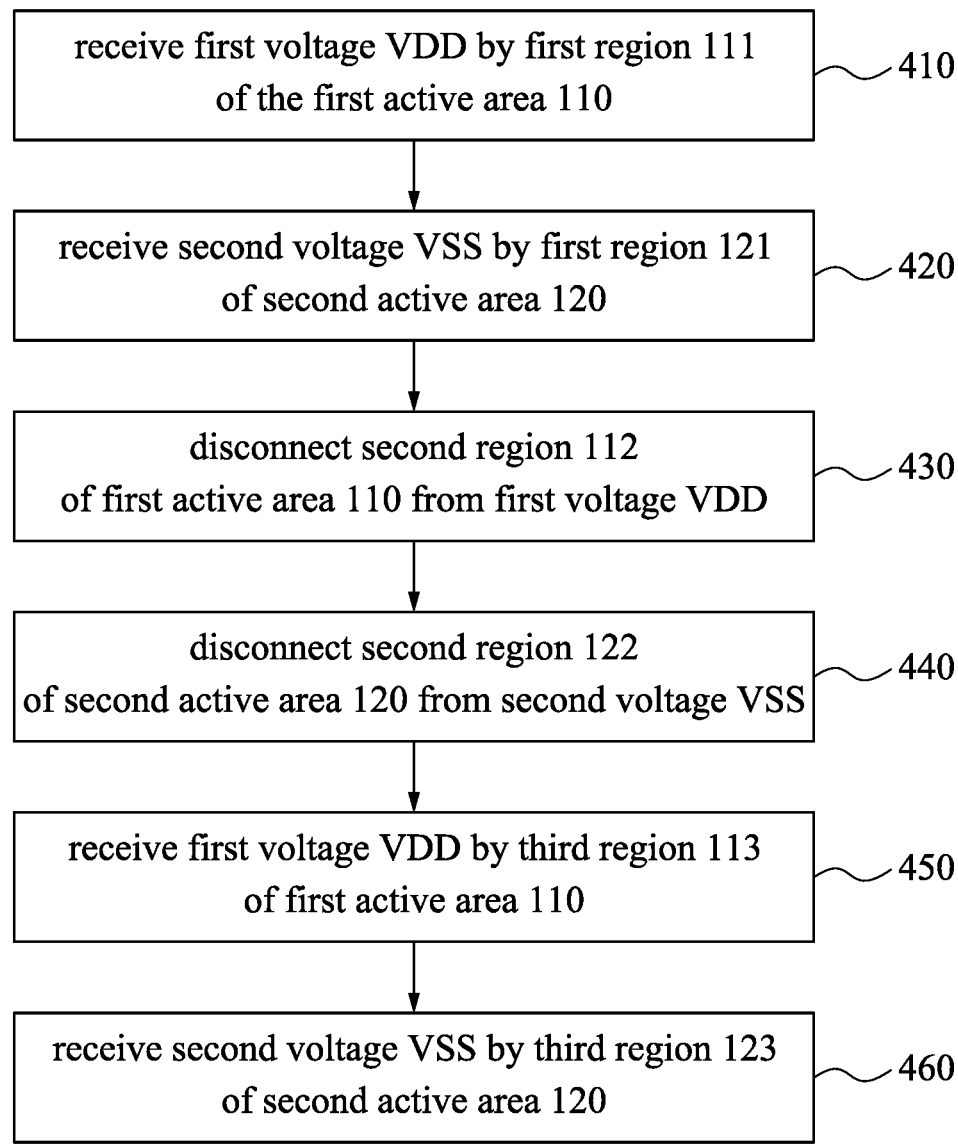
FIG. 4 is a flow chart of a method for fabricating the semiconductor device in FIG. 1, in accordance with various embodiments.

Reference is now made to FIG. 4. FIG. 4 is a flow chart of a method 400 for fabricating the semiconductor device 100 in FIG. 1, in accordance with various embodiments. For illustration, the fabricating process of the semiconductor device 100 in FIG. 1 is described by the method 400.

With reference to the method 400 in FIG. 4 in operation 410, the first region 111 of the first active area 110 is configured to receive a first voltage VDD. In some embodiments, referring to FIG. 1, FIG. 2 and FIG. 3, the metal contact 152 is coupled to the power source as shown in FIG. 3, and therefore, the first region 111 of the first active area 110 is configured to receive the first voltage VDD provided by the power source 800 through the metal contact 152.

In operation 420, the first region 121 of the second active area 120 is configured to receive a second voltage VSS. In some embodiments, referring to FIG. 1, FIG. 2 and FIG. 3, the metal contact 154 is coupled to ground 900, and therefore, the first region 121 of the second active area 120 is configured to receive the second voltage VSS introduced by the ground 800 through the metal contact 154. In various embodiments, the first voltage VDD is a power supply voltage or a high level voltage, and the second voltage VSS is ground voltage or a low level voltage. However, the scope of the disclosure is not intended to be limited in such kinds of the voltages, and other suitable kinds of the voltages are within the contemplated scope of the present disclosure.

In operation 430, the second region 112 of the first active area 110 is disconnected from the first voltage VDD. In some embodiments, referring to FIG. 1, FIG. 2, and FIG. 3, the second region 112 of the first active area 110 is not coupled to the metal contact 152, and therefore, the second region 112 of the first active area 110 is disconnected from the first voltage VDD provided by the power source 800.

In operation 440, the second region 122 of the second active area 120 is disconnected from the second voltage VSS. In some embodiments, referring to FIG. 1, FIG. 2, and FIG. 3, the second region 122 of the second active area 120 is not coupled to the metal contact 154, and therefore, the second region 122 of the second active area 120 is disconnected from the second voltage VSS introduced by the ground 900.

As illustrated in FIG. 1, a second gate 132 of the plurality of gates 131~139 is disposed adjacent to the first gate 131, the second region 112 of the first active area 110 and the second region 122 of the second active area 120 are arranged at a first side of the second gate 132, and a third region 113 of the first active area 110 and a third region 123 of the second active area 120 are arranged at a second side of the second gate 132. Explain in a different way, the second region 112 of the first active area 110 and the second region 122 of the second active area 120 are arranged at the left side of the second gate 132, and the third region 113 of the first active area 110 and the third region 123 of the second active area 120 are arranged at the right side of the second gate 132.

In some embodiments, the third region 113 of the first active area 110 is coupled to the metal contact 152, and the third region 123 of the second active area 120 is coupled to the metal contact 154.

With reference to the method 400 in FIG. 4, in operation 450, the third region 113 of the first active area 110 is configured to receive the first voltage VDD. In some embodiments, referring to FIG. 1, FIG. 2 and FIG. 3, the third region 113 of the first active area 110 is configured to receive the first voltage VDD provided by the power source 800 through the metal contact 152.

In operation 460, the third region 123 of the second active area 120 is configured to receive the second voltage VSS. In some embodiments, referring to FIG. 1, FIG. 2 and FIG. 3, the third region 123 of the second active area 120 is configured to receive the second voltage VSS introduced by the ground 900 through the metal contact 154.

The above description of the method 400 includes exemplary operations, but the operations of the method 400 are not necessarily performed in the order described. The order of the operations of the method 400 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

In some embodiments, referring to FIG. 1, the second region 112 of the first active area 110 and the second region 122 of the second active area 120 are floating. In various embodiments, the fourth region 114 of the first active area 110 and the fourth region 124 of the second active area 120 are floating. In some embodiments, referring to FIG. 1, the sixth regions 116, 126 and the seventh regions 117, 127 of the first active area 110 and the second active area 120 are floating.

As illustrated in FIG. 1, equivalent silicon controlled rectifier (SCR) circuits 142, 144, and 146 are parasitic SCRs occurred in the regions that receive the first voltage VDD and the second voltage VSS. Due to the configuration in FIG. 1, a portion of the regions receive the first voltage VDD and the second voltage VSS, and therefore, the number of the SCR circuits is reduced, and a high current leakage phenomenon generated by the SCR circuits is improved as well.

Figure 5:
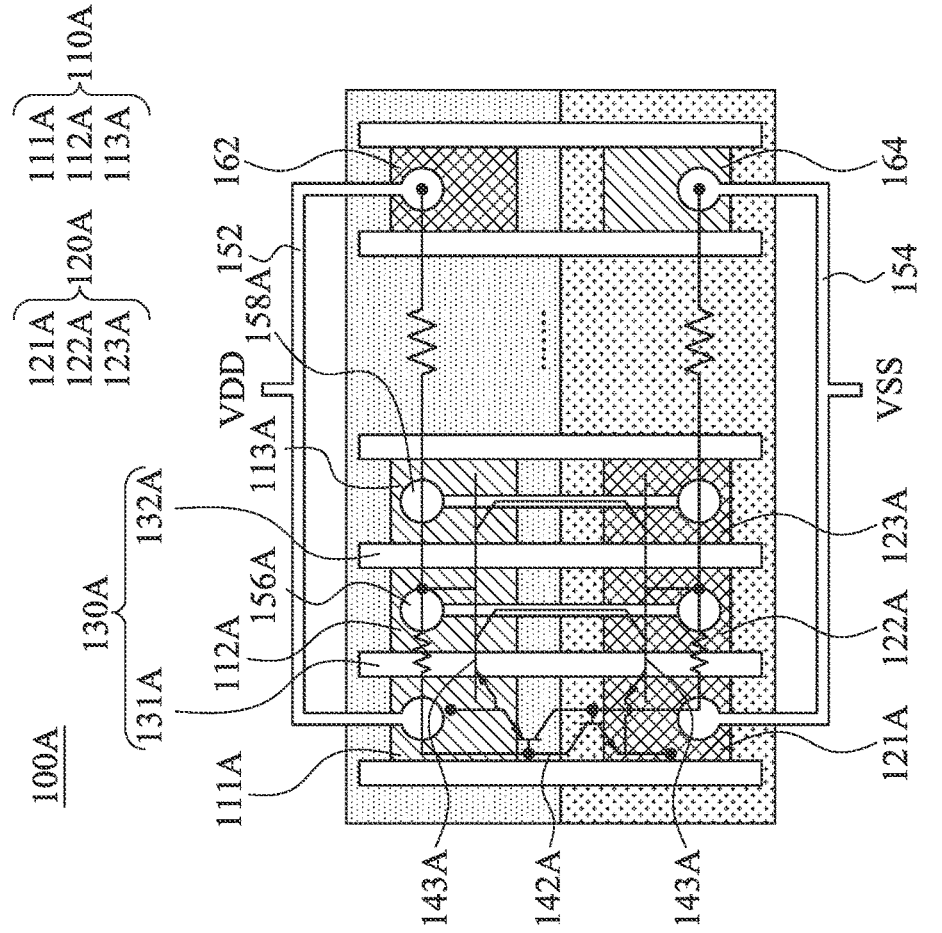
FIG. 5 is a diagram of a semiconductor device, in accordance with various embodiments.

Reference is now made to FIG. 5. FIG. 5 is a diagram of a semiconductor device 100A, in accordance with various embodiments. Compared with the semiconductor device 100 in FIG. 1, a portion of the connections of the semiconductor device 100A in FIG. 5 is different, which is described in detailed as below. As illustrated in FIG. 5, the first region 111A of the first active area 110 is still configured to receive the first voltage VDD, the first region 121A of the second active area 120A is still configured to receive the second voltage VSS, the second region 112A of the first active area 110A is still disconnected from the first voltage VDD, and the second region 122A of the second active area 120A is still disconnected from the second voltage VSS. It is noted that the second region 112A of the first active area 110A and the second region 122A of the second active area 120A are coupled to each other. In various embodiments, the second region 112A of the first active area 110A and the second region 122A of the second active area 120A are coupled to each other by a metal contact 156A.

In various embodiments, when there are noises occurred in the semiconductor device 100A in FIG. 5, the equivalent SCR circuit 142A is triggered. Meanwhile, a first type current introduced by the first voltage VDD and a second type current introduced by the second voltage VSS tend to flow through the metal contact 156A between the second region 112A of the first active area 110A and the second region 122A of the second active area 120A because the resistance of the metal contact 156A is lower than the resistance of the equivalent SCR circuit 142A. In view of the above, less current flows through the equivalent SCR circuit 142A, and the high current leakage phenomenon happened in the equivalent SCR circuit 142A is therefore improved.

In some embodiments, as illustrated in FIG. 5, the third region 113A of the first active area 110A is disconnected from the first voltage VDD, and the third region 123A of the second active area 120A is disconnected from the second voltage VSS. Due to the configuration in FIG. 5, part of the regions receive the first voltage VDD and the second voltage VSS, and therefore, the number of the SCR circuits is reduced, and the high current leakage phenomenon generated by the SCR circuits is further improved.

In various embodiments, the third region 113A of the first active area 110A and the third region 123A of the second active area 120A are coupled to each other. In some embodiments, the third region 113A of the first active area 110A and the third region 123A of the second active area 120A are coupled to each other by a metal contact 158A. Due to such configuration, the first type current introduced by the first voltage VDD and the second type current introduced by the second voltage VSS tend to flow through the metal contact 156A between the second region 112A and the second region 122A, and flows through the metal contact 158A between the third region 113A and the third region 123A because the resistance of the metal contact 158A is lower than the resistance of the equivalent SCR circuit 142A. Therefore, less and less current flows through the equivalent SCR circuit 142A, and the high current leakage phenomenon happened in the equivalent SCR circuit 142A is even more improved.

Furthermore, different types of the currents introduced by the first voltage VDD and the second voltage VSS are neutralized, which is explained in detailed in the following description regarding FIG. 6.

Figure 6:
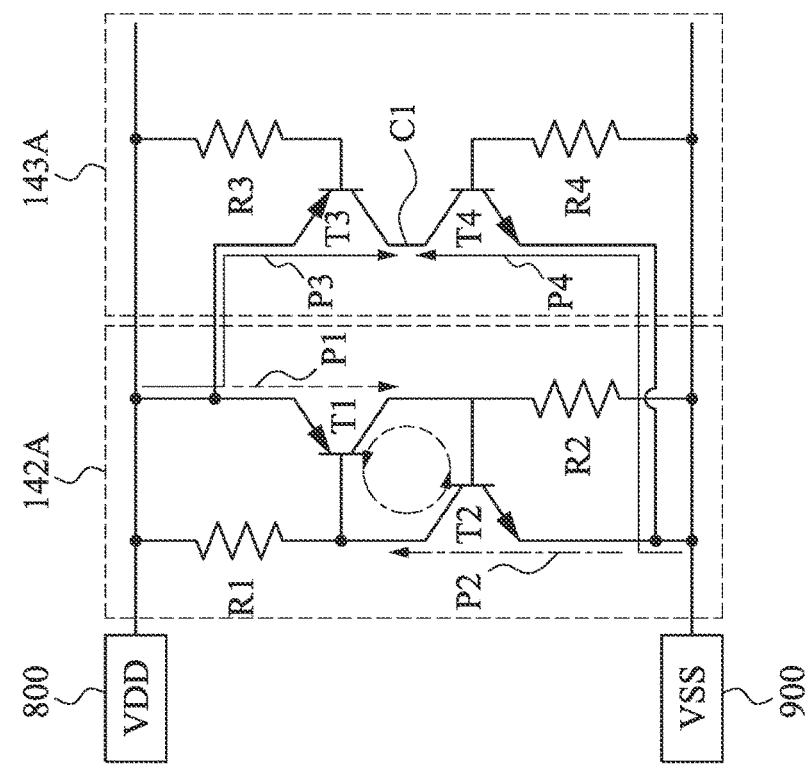
FIG. 6 is an equivalent circuit of the semiconductor device in FIG. 5, in accordance with various embodiments.

Reference is now made to FIG. 6. FIG. 6 is an equivalent circuit of the semiconductor device 100A in FIG. 5, in accordance with various embodiments. For facilitating the understanding of FIG. 6, reference is now made to FIG. 2, FIG. 5 and FIG. 6. The first region 111A of the first active area 110A, the first well 180, the second well 190, and the first region 121A of the second active area 120A are configured to operate as the equivalent SCR circuit 142A. The first region 111A of the first active area 110A and the first region 112A of the first active area 110A are regard as the parasitic transistor T3 of the parasitic circuit 143A, and the first region 121A of the second active area 120A and the second region 122A of the second active area 120A are regard as the parasitic transistor T4 of the parasitic circuit 143A.

As can be seen in FIG. 5 and FIG. 6, when there are noises occurred in the semiconductor device 100A and the equivalent SCR circuit 142A is triggered, the first type current introduced by the first voltage VDD originally flows through the path P1 and the second type current introduced by the second voltage VSS originally flows through the path P2, such that a short path of the equivalent SCR circuit 142A is formed and the high leakage current flows from the power source 800 to the ground 900. However, owing to the connection of the parasitic transistors T3, T4 established by the metal contact 156A, most of the first type current introduced by the first voltage VDD tends to flow through the path P3, and most of the second type current introduced by the second voltage VSS tends to flow through the path P4 when the equivalent SCR circuit 142A is triggered by noises.

In some embodiments, the first type current is composed of holes, and the second type current is composed of electrons. When the holes flow through the path P3 and the electrons flow through the path P4, the holes and the electrons neutralized at the connection of the parasitic transistors T3, T4 established by the metal contact 156A. In view of the above, the original high leakage current generated by the equivalent SCR circuit 142A not only tends to flow through the parasitic transistors T3~T4, but the neutralization occurs to reduce the high leakage current. Therefore, the high current leakage phenomenon happened in the equivalent SCR circuit 142A is even more improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first region disposed at a first side of a first gate;
    a second region disposed at the first side of the first gate;
    a third region coupled to the first region;
    a fourth region coupled to the second region;
    a fifth region disposed between the first region and the third region; and
    a sixth region disposed between the second region and the fourth region,
    wherein the first region and the third region are configured to receive a first voltage, the second region and the fourth region are configured to receive a second voltage and have a same voltage level, and the fifth region and the sixth region are disconnected from the first voltage and the second voltage, respectively.

2. The semiconductor device of claim 1, wherein the first gate is arranged across and extending from a first active area of a first type to a second active area of a second type, wherein the first type is different from the second type.

3. The semiconductor device of claim 1, further comprising:
    a first metal contact configured to couple the fifth region and the sixth region.

4. The semiconductor device of claim 1, further comprising:
    a seventh region disposed between the first region and fifth region;
    an eighth region disposed between the second region and the sixth region; and
    a second metal contact configured to couple the seventh region to the eighth region.

5. The semiconductor device of claim 4, wherein
    the seventh region and the eighth region are disconnected from the first voltage and the second voltage, respectively.

6. The semiconductor device of claim 1, further comprising:
    a current path formed by the first region, the third region, the fourth region, and the second region.

7. The semiconductor device of claim 1, wherein the third region and the fourth region are floated.

8. A semiconductor device, comprising:
    a plurality of gates each arranged above and across a first active area and a second active area, wherein the second active area is different from the first active area,
    a first metal contact configured to connect a first region and a second region of the first active area to a first voltage; and
    a second metal contact configured to connect a third region and a fourth region of the second active area to a second voltage,
    wherein at least two first gates of the plurality of gates are arranged between the first region and the second region, and the at least two first gates are arranged between the third region and the fourth region.

9. The semiconductor device of claim 8, further comprising:
    a fifth region of the first active area arranged between the first region and the second region; and
    a sixth region of the second active area arranged between the third region and the fourth region.

10. The semiconductor device of claim 9, further comprising:
    a third metal contact configured to couple the fifth region to the sixth region, to form a current path from the first region to the third region.

11. The semiconductor device of claim 9, wherein the fifth region and the sixth region are floated.

12. The semiconductor device of claim 9, further comprising:
    a first transistor formed by the first region, the fifth region, and one of the first gates disposed between the first region and the fifth region; and
    a second transistor formed by the second region, the sixth region, and the one of the first gates disposed between the second region and the sixth region.

13. The semiconductor device of claim 9, wherein the fifth region and the sixth region are arranged adjacent to each other and between two of the first gates.

14. The semiconductor device of claim 8, wherein the first region and the second region are disposed at a side of one of the at least two first gates.

15. A semiconductor device, comprising:
    a first metal contact configured to receive a first voltage signal;
    a first region coupled to the first metal contact;
    a second region coupled to the first metal contact;
    a second metal contact configured to receive a second voltage signal;
    a third region disconnected from the first voltage signal received by the first metal contact, and disconnected from the second voltage signal received by the second metal contact;
    a fourth region coupled to the second metal contact;
    a fifth region coupled to the second metal contact;
    a sixth region disconnected from the first voltage signal received by the first metal contact, and disconnected from the second voltage signal received by the second metal contact;
    a first gate arranged between the first region and the third region and arranged between the fourth region and the sixth region; and
    a second gate arranged between the second region and the third region and arranged between the fifth region and the sixth region.

16. The semiconductor device of claim 15, further comprising:
a third metal contact configured to couple the third region and the sixth region.

17. The semiconductor device of claim 16, wherein the first gate, the first region and the third region are configured to operate as a first transistor, and the first gate, the fourth region and the sixth region are configured to operate as a second transistor, and
first terminals of the first transistor and the second transistor are coupled with each other via the third metal contact.

18. The semiconductor device of claim 17, wherein the first region and the second region are configured to operate as an equivalent silicon controlled rectifier (SCR) circuit coupled to second terminals of the first transistor and the second transistor.

19. The semiconductor device of claim 15, further comprising:
a seventh region disposed between the third region and the second gate, and decoupled from the first metal contact and the second metal contact;
an eighth region disposed between the sixth region and the second gate, and decoupled from the first metal contact and the second metal contact; and
a third metal contact configured to couple the seventh region and the eighth region.

20. The semiconductor device of claim 19, further comprising:
a first well, wherein the first region, the second region, the third region and the seventh region are disposed in the first well; and
a second well, wherein the fourth region, the fifth region, the sixth region and the eighth region are disposed in the second well,
wherein types of the first well and second well are different.

* * * * *